(12) United States Patent
Kreh et al.

(10) Patent No.: US 7,265,823 B2
(45) Date of Patent: Sep. 4, 2007

(54) SYSTEM FOR THE DETECTION OF MACRODEFECTS

(75) Inventors: Albert Kreh, Solms (DE); Henning Backhauss, Wetzlar (DE); Rene Schenck, Jena (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 328 days.

(21) Appl. No.: 10/978,527

(22) Filed: Nov. 2, 2004

(65) Prior Publication Data

US 2005/0101036 A1 May 12, 2005

(30) Foreign Application Priority Data

Nov. 6, 2003 (DE) ................................ 103 51 848

(51) Int. Cl.
*G01N 21/00* (2006.01)
(52) U.S. Cl. ................................ 356/237.4; 356/237.5
(58) Field of Classification Search .. 356/237.1–237.5, 356/394; 118/715, 712, 319; 438/773
See application file for complete search history.

(56) References Cited

U.S. PATENT DOCUMENTS

| | | | |
|---|---|---|---|
| 5,814,116 A | 9/1998 | Schneider et al. | |
| 6,758,876 B2 * | 7/2004 | Suzuki et al. | 55/385.6 |
| 6,842,932 B2 * | 1/2005 | Ishihara | 15/77 |
| 7,022,009 B2 * | 4/2006 | Kim | 454/187 |
| 2005/0134839 A1 * | 6/2005 | Kreh et al. | 356/237.2 |
| 2007/0040241 A1 * | 2/2007 | Halama et al. | 257/620 |

FOREIGN PATENT DOCUMENTS

| | | |
|---|---|---|
| DE | 43 10 149 C2 | 10/1994 |
| DE | 195 38 040 C2 | 4/1997 |
| DE | 10 2004 062 592 B3 * | 6/2006 |
| EP | 0 335 752 B1 | 9/1994 |
| JP | 5-33767 * | 2/1993 |
| WO | WO 2005/004208 * | 1/2005 |

* cited by examiner

*Primary Examiner*—Hoa Q. Pham
(74) *Attorney, Agent, or Firm*—Foley & Lardner LLP

(57) ABSTRACT

A system for the detection of macrodefects is disclosed, the system being surrounded by a housing (50) and being subdivided into a first segment (6), a second segment (8), and a third segment (10). Provided in the second segment (8) is a stage (2), displaceable in the X direction and Y direction, on which a wafer (25) is placed. Located in the first segment (6) is an aspiration device (36) that directs aspirated air via an air guide (37) into the second segment (8), the air guide (37) encompassing several air-directing panels (38) so that an air flow (60) is guided in parallel fashion over the wafer (25).

12 Claims, 4 Drawing Sheets

SYSTEM FOR THE DETECTION OF MACRODEFECTS

CROSS REFERENCE TO RELATED APPLICATIONS

This application claims priority of the German patent application 103 51 848.7 which is incorporated by reference herein.

FIELD OF THE INVENTION

The invention concerns a system for the detection of macrodefects.

BACKGROUND OF THE INVENTION

In semiconductor production, wafers are sequentially processed in a plurality of process steps during the production process. With increasing integration density, demands in terms of the quality of the features configured on the wafers are rising. To allow the quality of the configured features to be checked, and any defects to be found, there is a corresponding requirement in terms of the quality, accuracy, and reproducibility of the components and process steps with which the wafers are handled. This means that in the production of a wafer with the plurality of process steps and the plurality of layers of photoresist or the like that are to be applied, reliable and timely detection of defects in the individual features is particularly important. A plurality of identical repeating pattern elements are provided on a patterned semiconductor substrate or a wafer.

DE 43 10 149 C2 discloses a device for handling disk-shaped objects in a treatment plane of a local clean room. Also provided are magazine receptacles that are adjustable vertically with respect to the treatment plane. Workstations for processing or inspection purposes are located in the treatment plane. The treatment plane is arranged above an intermediate floor that subdivides the clean room into two sub-spaces, located one above another, in which one air flow component of an air flow is directed out of the sub-space above the intermediate floor into the sub-space, containing the drive parts, below the intermediate floor. The air flow prevents any abraded material caused by the drive elements from traveling to the workstations in the treatment plane. The air preparation system comprises a housing, and its air outlet is constituted by a circle-sector-shaped cutout having air-directing panels. Nothing is mentioned regarding the particular orientation, guidance, and/or direction of the air flow within the housing.

German Patent DE 195 38 040 C2 discloses a device for generating a purified turbulent air flow for supplying local clean rooms. The local clean room is surrounded by a housing. The housing possesses an inlet for the air on a side wall. Provided behind the inlet is a radial fan with which air is forced into the inner space of the device. An air outlet is provided on the wall arranged opposite the wall having the inlet. The flow distribution of the air in the interior of the local clean room is not mentioned or taken into account.

European Patent EP 0 335 752 discloses a system for semiconductor manufacture under clean-room conditions. The system comprises a building surrounded by walls, the clean-room conditions existing in a portion of the building. Air is conveyed into the clean room through filters. Holes in the floor of the clean room direct clean air, for example, to another part of the facility. Nothing is disclosed here concerning direction or guidance of the air flow.

SUMMARY OF THE INVENTION

It is the object of the invention to create a system in which conditions that do not negatively affect the detection of macrodefects are present in the system.

This object is achieved by a system for the detection of macrodefects, the system comprises:
a housing which is subdivided into a first segment, a second segment, and a third segment,
a stage, displaceable in the X direction and Y direction and provided in the second segment, on which a wafer is placed,
an aspiration device, provided in the first segment and directing aspirated air via an air guide into the second segment,
several air-directing panels are provided in the air guide, so that an air flow is guided in parallel fashion over the wafer.

It is particularly advantageous if the system is surrounded by a housing and is subdivided into a first segment, a second segment, and a third segment. Provided in the second segment is a stage, displaceable in the X direction and Y direction, on which a wafer is placed. Provided in the first segment is an aspiration device that directs aspirated air via an air guide into the second segment, the air guide encompassing several air-directing panels so that an air flow is guided in parallel fashion over the wafer.

The first segment is separated from the second segment by a mounting plate. The second segment is likewise separated from the third segment by a separating plate. The first segment is subdivided into a first and a second region, the second region containing the aspiration device for the system's air.

Arranged in the first region of the first segment are substantially several illumination devices and at least one detection device, the first region further encompassing an electronic control system for the illumination devices and detection device.

The mounting plate has several passthroughs through which a first portion of the air flow travels out of the second segment into the first region of the first segment. The separating plate likewise has at least one passthrough through which a second portion of the air flow travels out of the second segment into the third segment. In the second segment, an air pressure exists that is approximately 1 Pa higher than in the adjacent first segment and the adjacent third segment. The housing of the system encompasses a floor, the second portion of the air flow leaving the housing and the third segment through the floor.

The first portion of the air flow cools the electronic control system in the first region of the first segment, and the second portion of the air flow cools the control units in the third segment of the system.

BRIEF DESCRIPTION OF THE DRAWINGS

The subject matter of the invention is depicted schematically in the drawings and will be described below with reference to the Figures, in which.

DETAILED DESCRIPTION OF THE INVENTION

Figure 1:
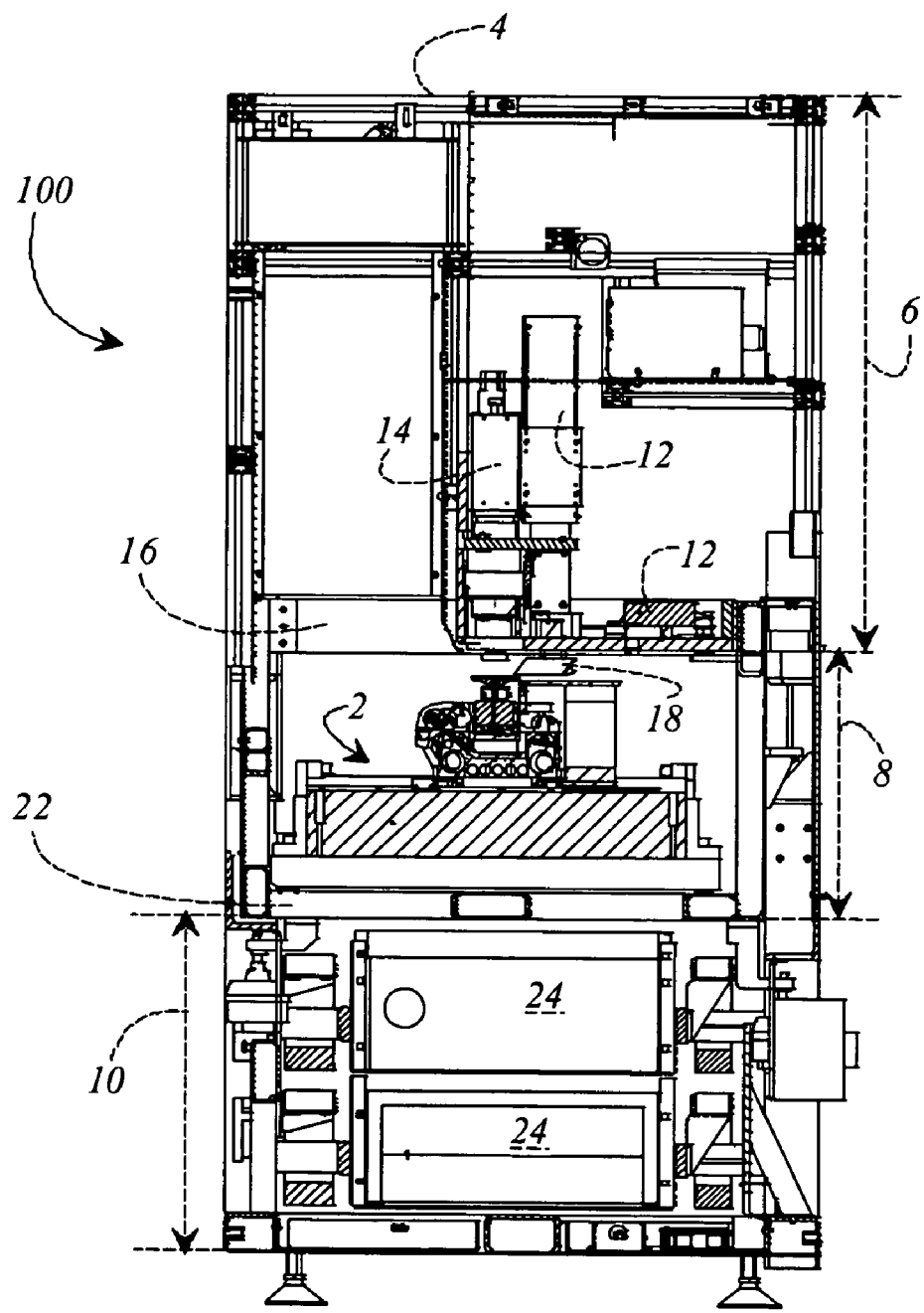
FIG. 1 schematically depicts the construction of the overall system for the inspection of wafers and the detection of macrodefects.

FIG. 1 depicts the arrangement of stage 2 in overall system 100 for the inspection of wafers. System 100 is enclosed by a housing 4 and is subdivided into a first segment 6, a second segment 8, and a third segment 10. Housing 4 is closed off on all external surfaces by walls (not depicted), so that specific climatic or clean-room conditions are present in the interior of housing 4. Housed in first segment 6 of housing 4 are substantially several illumination devices 12 and at least one detection device 14. Detection device 14 is usually a CCD camera. First segment 6 is separated from second segment 8 by a mounting plate 16. The light of illumination devices 12 is directed via optical means 18 through mounting plate 16 onto the surface of the wafer to be inspected. Stage 2, which is movable in X direction X and in the Y direction, is provided in second segment 8. Stage 2 is mounted on a separating plate 22 that separates second and third segments 8 and 10 from one another. Third segment 10 encompasses several control units 20 or computers that are responsible for controlling, monitoring, and regulating system 100 and the individual components of system 100. In addition, data can likewise be acquired and evaluated therewith.

Figure 2:
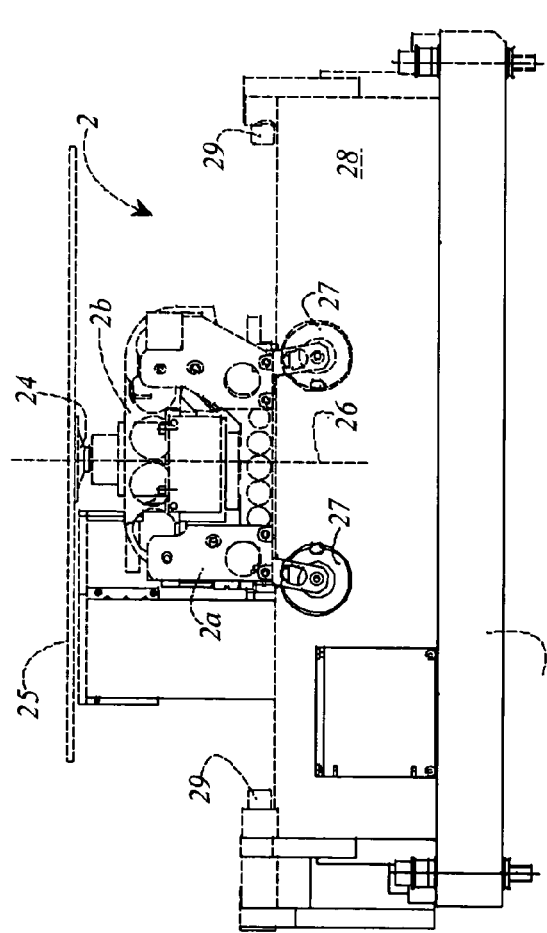
FIG. 2 is a side view of the stage parallel to the X direction.
Figure 3:
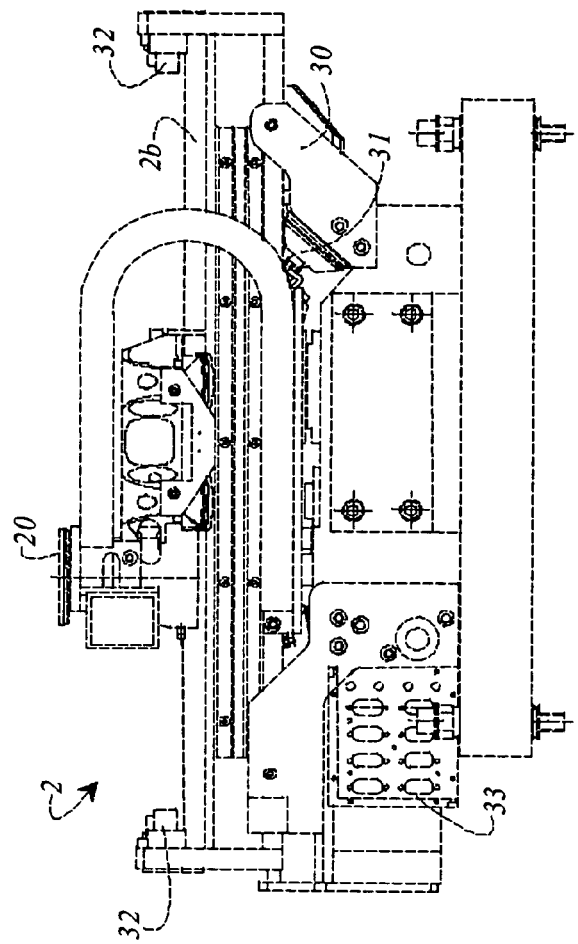
FIG. 3 is a side view of the stage parallel to the Y direction.

FIG. 2 is a side view of stage 2. A wafer 25 is placed on a receptacle 24, and receptacle 24 is furthermore rotatable about a rotation axis 26. Stage 2 comprises a first stage element 2a and a second stage element 2b. First stage element 2a coacts with several air nozzles 27 and at least one first rail 28. Through air nozzles 27, gas is blown out at a pressure higher than the prevailing standard pressure. Air cushions that permit first stage element 2a to slide in almost frictionless fashion along first rail 28 are thus produced between air nozzles 27 and first rail 28. The motion of first stage element 2a is restricted at both ends by stops 29. FIG. 3 is a side view of stage 2 parallel to direction Y in FIG. 1. Second stage element 2b is displaceable along second rail 30. Second rail 30 coacts with several air nozzles 31 that are provided on second stage element 2b. Air nozzles 31 produce, by way of the gas emerging under pressure, an air cushion on which second stage element 2b slides along second rail 30. The motion of second stage element 2b is limited at both ends by stops 32. Stage 2 further encompasses a control unit 33 by means of which the electrical elements and air delivery to air nozzles 27 and 31 of first and second stage elements 2a and 2b are controlled and regulated. As depicted for example in FIG. 3, a flexible belt 34 is guided to second stage element 2b The corresponding electrical and air lines from control unit 33 to second stage element 2b and to its air nozzles 31 are provided in or on flexible belt 34.

Figure 4:
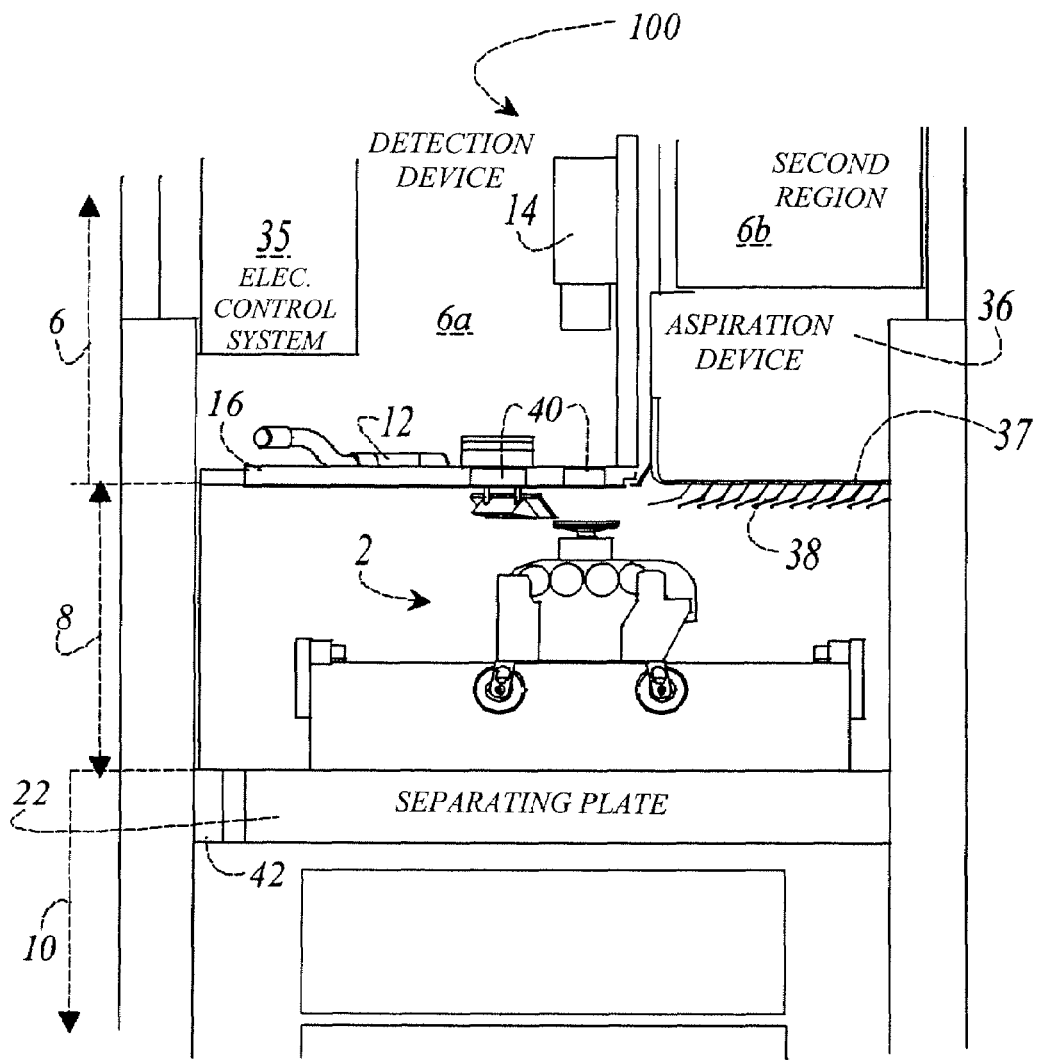
FIG. 4 is a detail view of the system in the region around the stage that is movable in the X and Y directions.

FIG. 4 is a detail view of system 100 in the region around stage 2 that is movable in the X and Y directions. First segment 6 is subdivided into a first and a second region 6a and 6b. Electronic control system 35 for the illumination devices is provided in first region 6a. In addition to electronic control system 35, illumination devices 12 and detection device (or camera) 14 are likewise provided in first region 6a. Second region 6b encompasses an aspiration device 36 for the ambient air of system 100. Aspiration device 36 ends in second segment 8. Air is directed out of aspiration device 36 into second segment 8 via an air guide 37 into the second segment. The air guide encompasses several air-directing panels 38 that direct air in suitable fashion into second segment 8. Stage 2 is beneath receptacle 24 for wafer 25 in second segment 8. Mounting plate 16 separates first segment 6 from second segment 8. Configured in mounting plate 16 are passthroughs 40 through which the light from illumination devices 12 and the light from second segment 8 travels back into to detection device 14. Passthroughs 40 can be closed off by a transparent window 40a. It is particularly advantageous if the passthrough in front of detection device 14 is configured without a transparent window. If that passthrough 40 were provided with a window, particles could then settle thereonto and negatively influence imaging by way of detection device 14. Stage 2 is carried by separation plate 22 that separates the second from the third segment. Separating plate 22 is configured in such a way that at least one passthrough 42 is formed between second segment 8 and the third segment.

Figure 5:
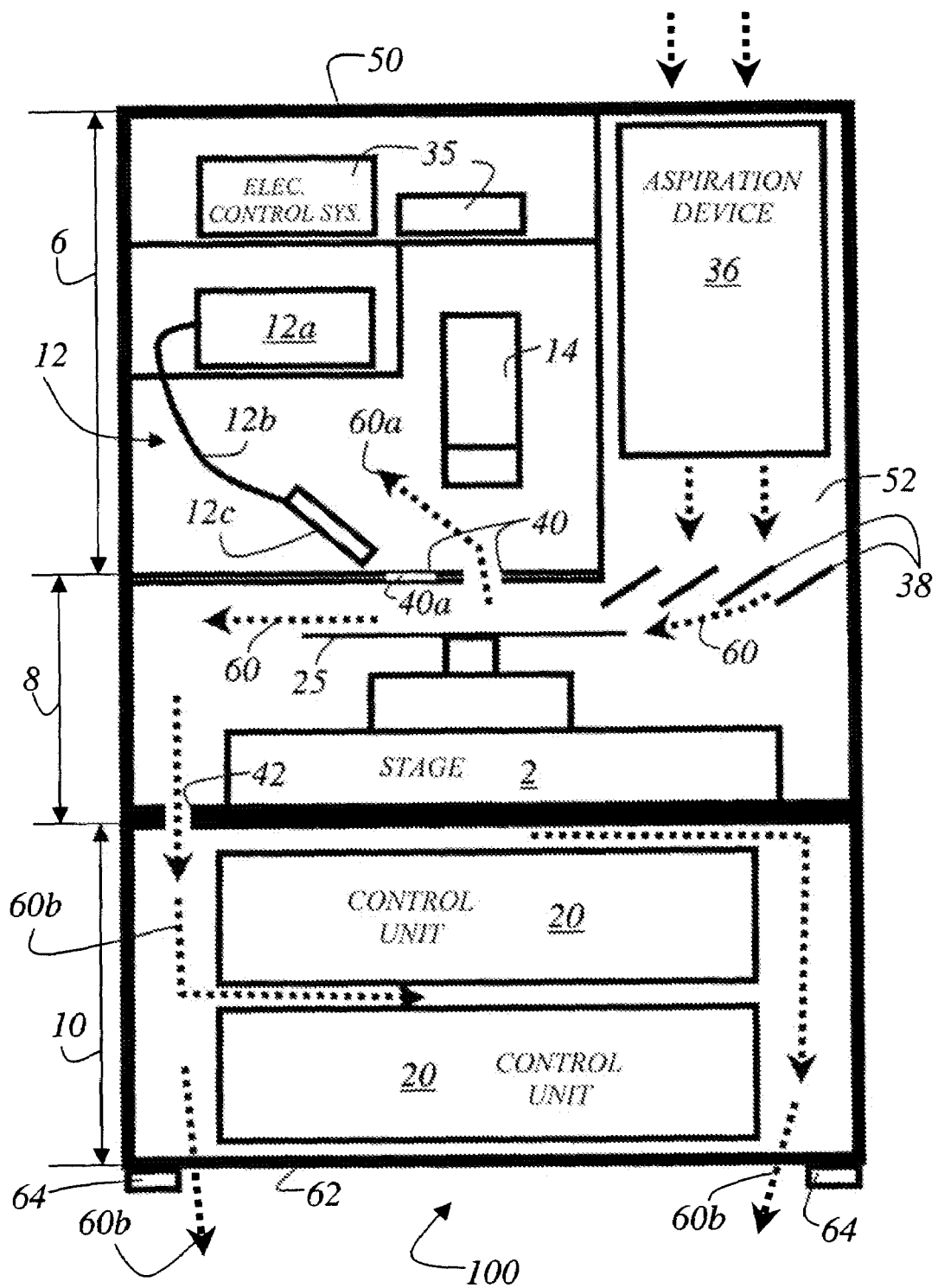
FIG. 5 schematically depicts the air flow and its guidance within the system.

FIG. 5 schematically depicts air flow 60 and its guidance within system 100 according to the present invention. The overall system is enclosed by a housing 50. Housing 50 is constituted from several walls that close off system 100 from the outside. As already mentioned in the description of FIG. 4, air flow 60 is directed from aspiration device 36 via air-directing panels 38 into second segment 8 of system 100. Air is forced by an aspiration device 36 into a vertical air conduit 52. In vertical air conduit 52, air-directing panels 38 are inserted in such a way that air flow 60 in second segment 8 is deflected horizontally and is guided in parallel fashion over wafer 25. Wafer 25 is placed in second segment 8 on receptacle 24 of stage 2. In order to reduce the footprint of the overall system 100, second segment 8, having the highest clean-room class (e.g. DIN ISO class 3), is confined to the smallest possible space. This smallest possible space exists in second segment 8. In second segment 8, the air pressure is approximately 1 Pa higher than in the adjacent areas (first and third segments 6 and 10). This prevents contamination of second segment 8, in which wafer 25 is located, from outside. Electronic systems, light sources, optical systems, movable mechanisms, and other equipment are arranged to the greatest extent possible outside segment 8. A lower clean-room class (e.g. DIN ISO class 6) exists in first and in third segment 6 and 10. Second segment 8 is delimited at the top, toward first segment 6, by mounting plate 16. Illuminating and imaging optical systems are mounted on this mounting plate 16. In this mounting plate 16, passthroughs 40 or 42 having recessed and/or attached optical elements (e.g. glass panels, mirrors, etc.) allow illumination and imaging of the image field on the surface of wafer 25 without negatively influencing the air flow. Electronic and optical systems, light sources, and adjustment elements are housed in first segment 6 above mounting plate 16. Stage 2 that is movable in the X direction and Y direction is constructed, and arranged in second segment 8 beneath wafer 2, in such a way that as few particles as possible occur as stage 2 moves. Stage 2 rests on a separating plate 22 that closes off second segment 8 (except for a few passthroughs 42) at the bottom. Control units 33 (electronics, computers, etc.) are located in third segment 10 below separating plate 22. The provision of passthroughs 42 means that the air flow is conveyed principally into third segment 10 of system 100. A first portion 60a of the air flow also flows into first segment 6 via mounting plate 16. With this configuration, air flow 60 in second region 8 is optimized, and contamination of wafer 25 is minimized. First portion 60a of the air flow and second portion 60b of the air flow simultaneously cool electronic systems in first and third segments 6 and 10, as well as illumination devices 12 in first segment 6. Illumination devices 12 are embodied as flash lamps 12*a* having a luminous surface 12*c*. Light is guided from flash lamp 12*a* to luminous surface 12*c* via a light-guiding fiber 12*b*. Flash lamps 12*a* emit light having a spectral composition and pulse duration selectable by the user. First segment 6 encompasses further electronic systems 64 that serve to control flash lamps 12*a* and to evaluate the signals acquired with detection device 14. Housing 50 stands on feet 64, so that floor 62 is spaced away from the installation surface.

What is claimed is:

1. A system for the detection of macrodefects, the system comprises:
   a housing which is subdivided into a first segment, a second segment, and a third segment,
   a stage, displaceable in the X direction and Y direction and provided in the second segment, on which a wafer is placed,
   an aspiration device, provided in the first segment and directing aspirated air via an air guide into the second segment,
   several air-directing panels are provided in the air guide, so that an air flow is guided in parallel fashion over the wafer;
   wherein the first segment is separated from the second segment by a mounting plate:
   wherein the second segment is separated from the third segment by a separating plate:
   wherein the separating plate carries the stage that is displaceable in the X direction and Y direction.

2. The system as defined in claim 1, wherein the first segment is subdivided into a first and a second region, the second region containing the aspiration device for the system's air.

3. The system as defined in claim 2, wherein substantially several illumination devices and at least one detection device are arranged in the first region of the first segment, the first region further encompassing an electronic control system for the illumination devices and detection device.

4. The system as defined in claim 2, wherein a first portion of the air flow cools an electronic control system in the first region of the first segment; and a second portion of the air flow cools control units in the third segment.

5. The system as defined in claim 1, wherein the third segment contains several control units or computers that serve to control, monitor, and regulate the system.

6. The system as defined in claim 1, wherein the mounting plate has several passthroughs through which a first portion of the air flow travels out of the second segment into the first segment.

7. The system as defined in claim 1, wherein the separating plate has at least one passthrough through which a second portion of the air flow travels out of the second segment into the adjacent third segment.

8. The system as defined in claim 1, wherein in the second segment, the air pressure is approximately 1 Pa higher than in the adjacent first segment and the adjacent third segment.

9. The system as defined in claim 1, wherein a higher clean-room class exists in the second segment than in the first segment or third segment.

10. The system as defined in claim 7, wherein the housing of the system encompasses a floor and the second portion of the air flow leaves the housing and the third segment through the floor.

11. A system for the detection of macrodefects, the system comprises:
    a housing which is subdivided into a first segment, a second segment, and a third segment, wherein the first segment is separated from the second segment by a mounting plate, and wherein the second segment is separated from the third segment by a separating plate,
    a stage, displaceable in the X direction and Y direction and provided in the second segment, on which a wafer is placed,
    an aspiration device, provided in the first segment and directing aspirated air via an air guide into the second segment,
    several air-directing panels are provided in the air guide, so that an air flow is guided in parallel fashion over the wafer and wherein in the second segment, the air pressure is approximately 1 Pa higher than in the adjacent first segment and the adjacent third segment;
    wherein the separating plate carries the stage that is displaceable in the X direction and Y direction.

12. A system for the detection of macrodefects, the system comprises:
    a housing which is subdivided into a first segment, a second segment, and a third segment, wherein the first segment is separated from the second segment by a mounting plate, and wherein the second segment is separated from the third segment by a separating plate,
    several passthroughs in the mounting plate through which a first portion of the air flow travels out of the second segment into the first segment,
    at least one passthrough through which a second portion of the air flow travels out of the second segment into the adjacent third segment,
    a stage, displaceable in the X direction and Y direction and provided in the second segment, on which a wafer is placed,
    an aspiration device, provided in the first segment and directing aspirated air via an air guide into the second segment,
    several air-directing panels are provided in the air guide, so that an air flow is guided in parallel fashion over the wafer,
    wherein the separating plate carries the stage that is displaceable in the X direction and Y direction.

* * * * *